United States Patent
Smith et al.

(10) Patent No.: US 8,669,588 B2
(45) Date of Patent: Mar. 11, 2014

(54) EPITAXIALLY-GROWN POSITION SENSITIVE DETECTOR

(75) Inventors: Edward Peter Gordon Smith, Santa Barbara, CA (US); Gregory Mark Venzor, Santa Barbara, CA (US); Eric J. Beuville, Goleta, CA (US)

(73) Assignee: Raytheon Company, Waltham, MA (US)

( * ) Notice: Subject to any disclaimer, the term of this patent is extended or adjusted under 35 U.S.C. 154(b) by 342 days.

(21) Appl. No.: 12/497,878

(22) Filed: Jul. 6, 2009

(65) Prior Publication Data

US 2011/0001165 A1    Jan. 6, 2011

(51) Int. Cl.
*H01L 31/107*    (2006.01)

(52) U.S. Cl.
USPC ........... 257/186; 257/184; 257/188; 257/440; 257/461; 257/E31.09; 438/94; 250/214.1

(58) Field of Classification Search
USPC .......... 257/184, 188, 440, 461, E31.019, 186; 438/94; 250/214, 214.1
See application file for complete search history.

(56) References Cited

U.S. PATENT DOCUMENTS

| | | | |
|---|---|---|---|
| 4,468,685 A | 8/1984 | Farrow et al. | |
| 4,686,761 A * | 8/1987 | Hacskaylo | 438/73 |
| 4,791,467 A | 12/1988 | Amingual et al. | |
| 4,970,566 A | 11/1990 | Mendelhall | |
| 5,001,335 A | 3/1991 | Takaoka et al. | |
| 5,113,076 A | 5/1992 | Schulte | |
| 5,114,866 A | 5/1992 | Ito et al. | |
| 5,149,956 A | 9/1992 | Norton | |
| 5,279,974 A | 1/1994 | Walsh | |
| 5,300,777 A | 4/1994 | Goodwin | |
| 5,380,669 A | 1/1995 | Norton | |
| 5,389,575 A | 2/1995 | Chin et al. | |
| 5,479,047 A | 12/1995 | Liao et al. | |
| 5,581,084 A | 12/1996 | Chapman et al. | |
| 5,621,238 A * | 4/1997 | Dodd et al. | 257/440 |
| 5,731,621 A | 3/1998 | Kosai | |
| 5,751,005 A | 5/1998 | Wyles et al. | |
| 5,936,268 A * | 8/1999 | Cockrum et al. | 257/188 |
| 5,959,339 A | 9/1999 | Chapman et al. | |

(Continued)

FOREIGN PATENT DOCUMENTS

WO    2007135850 A1    11/2007

OTHER PUBLICATIONS

Hamamatsu Photonics, Solid State Division; "PSD (Position Sensative Detector)"; pp. 16, Jul. 2003.

*Primary Examiner* — Matthew Reames
*Assistant Examiner* — Farid Khan
(74) *Attorney, Agent, or Firm* — Lando & Anastasi, LLP

(57) ABSTRACT

A unit cell for use in an imaging system may include an absorber layer of semiconductor material formed on a semiconductor substrate, at least one contact including semiconductor material formed on the semiconductor substrate and electrically coupled to the absorber layer, and a cap layer of semiconductor material formed on the semiconductor substrate and electrically coupled to and formed between the absorber layer and the at least one contact. The absorber layer may be configured to absorb incident photons such that the absorbed photons excite electrons in the absorber layer to generate a photocurrent. The at least one contact may be configured to conduct the photocurrent to one or more electrical components external to the unit cell. The cap layer may be configured to conduct the photocurrent between the absorber layer and the at least one contact.

17 Claims, 3 Drawing Sheets

(56) References Cited

U.S. PATENT DOCUMENTS

| | | |
|---|---|---|
| 6,147,349 A | 11/2000 | Ray |
| 6,359,290 B1 | 3/2002 | Ehmke |
| 6,492,239 B2 | 12/2002 | Yang et al. |
| 6,573,488 B1 | 6/2003 | Takeshita et al. |
| 6,657,194 B2 | 12/2003 | Ashokan et al. |
| 6,815,790 B2 | 11/2004 | Bui et al. |
| 6,956,214 B2 | 10/2005 | Wong et al. |
| 6,962,835 B2 | 11/2005 | Tong et al. |
| 7,217,982 B2 | 5/2007 | Taylor et al. |
| 7,333,181 B1 | 2/2008 | Scott et al. |
| 7,387,944 B2 | 6/2008 | Tong et al. |
| 7,728,297 B2 | 6/2010 | Masafumi |
| 2002/0109147 A1* | 8/2002 | Shirai et al. .................. 257/93 |
| 2003/0102432 A1 | 6/2003 | Boieriu et al. |
| 2003/0160172 A1 | 8/2003 | Ashokan et al. |
| 2004/0135224 A1* | 7/2004 | Bui et al. .................. 257/461 |
| 2004/0195509 A1 | 10/2004 | Sundaram et al. |
| 2005/0012030 A1* | 1/2005 | Mahajan et al. ........... 250/214.1 |
| 2005/0083567 A1 | 4/2005 | Chun Liu et al. |
| 2007/0215900 A1 | 9/2007 | Maimon |
| 2007/0235758 A1* | 10/2007 | Klipstein .................. 257/188 |
| 2009/0242934 A1* | 10/2009 | Hu .................. 257/186 |
| 2010/0308371 A1* | 12/2010 | Bui et al. .................. 257/184 |
| 2011/0001165 A1 | 1/2011 | Smith et al. |

* cited by examiner

EPITAXIALLY-GROWN POSITION SENSITIVE DETECTOR

GOVERNMENT LICENSE RIGHTS

This invention was made with Government support via Contract number HQ0006-06-D-0003 (Missile Defense Agency) awarded by the Missile Defence Agency (MDA/DV). The Government has certain rights in this invention.

TECHNICAL FIELD

This disclosure relates in general to image sensing and more particularly to an image sensing system and method utilizing a position sensitive detector.

BACKGROUND

Photodetector circuits are utilized in various devices (e.g., focal plane arrays and other photo-sensing circuits) to sense incident light in the visible and non-visible spectra. Certain photodetector circuits employ one or more position sensitive detectors (PSDs) that can measure a position of incident light upon the PSD.

Traditionally, individual PSDs are constructed from a PiN diode or similar device. FIG. 1 depicts a typical PSD 10. PSD 10 may include a semiconductor substrate 12 which includes a PN junction. Illumination 18 may impinge substrate 12 at a location 20, generating a photocurrent by means of the photovoltaic effect. Such photocurrent may flow through one or more of anodes 14 and cathode 16 depending upon the location of the incident illumination 18. Accordingly, the position of location 20 may be computed by analyzing the currents $i_{x1}$, $i_{x2}$, $i_{y1}$, and $i_{y2}$ (e.g., location coordinates x and y may be computed by the equations $x=K_x(i_{x2}-i_{x1})/(i_{x2}+i_{x1})$ and $y=K_y(i_{y2}-i_{y1})/(i_{y2}+i_{y1})$, where $K_x$ and $K_y$ are scaling constants based on size, electrical characteristics, and other properties of PSD 10).

However, traditional PSDs have many disadvantages. For example, conventional PSDs do not permit detection of infrared wavelengths. In additional, traditional approaches to fabricating PSDs do not readily permit optimizing electrical parameters of the PSDs, such as substrate/sheet resistance and contact resistance.

SUMMARY OF THE DISCLOSURE

According to one embodiment, a unit cell for use in an imaging system may include an absorber layer of semiconductor material formed on a semiconductor substrate, at least one contact including semiconductor material formed on the semiconductor substrate and electrically coupled to the absorber layer, and a cap layer of semiconductor material formed on the semiconductor substrate and electrically coupled to and formed between the absorber layer and the at least one contact. The absorber layer may be configured to absorb incident photons such that the absorbed photons excite electrons in the absorber layer to generate a photocurrent. The at least one contact may be configured to conduct the photocurrent to one or more electrical components external to the unit cell. The cap layer may be configured to conduct the photocurrent between the absorber layer and the at least one contact.

Technical advantages of certain embodiments include a position sensitive detector that may be optimized for particular applications and uses (e.g., for use with particular desired wavelengths, including infrared wavelengths). Methods and systems disclosed herein may also provide for optimization of sheet resistances and contact resistances associated with a position sensitive detector.

Other technical advantages will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present disclosure and its advantages, reference is now made to the following description, taken in conjunction with the accompanying drawings, in which.

DETAILED DESCRIPTION OF THE DISCLOSURE

Embodiments of the present disclosure and its advantages are best understood by referring to FIGS. 2 through 5B of the drawings, like numerals being used for like and corresponding parts of the various drawings.

Figure 1:
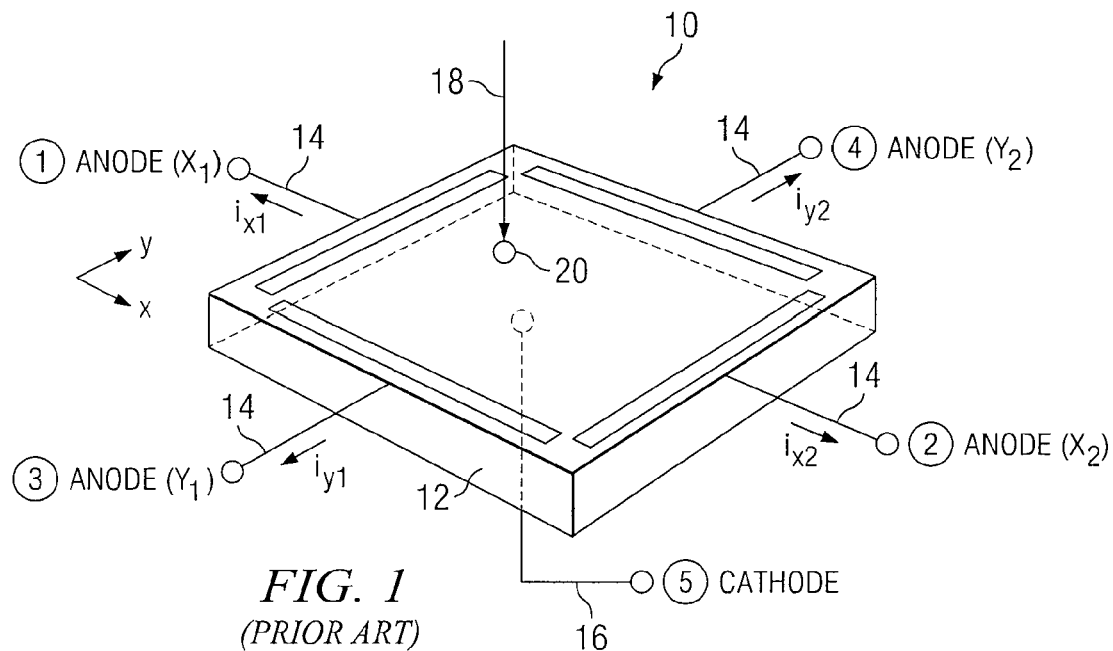
FIG. 1 depicts a simplified schematic diagram illustrating a PiN position sensitive detector, as is known in the art.
Figure 2:
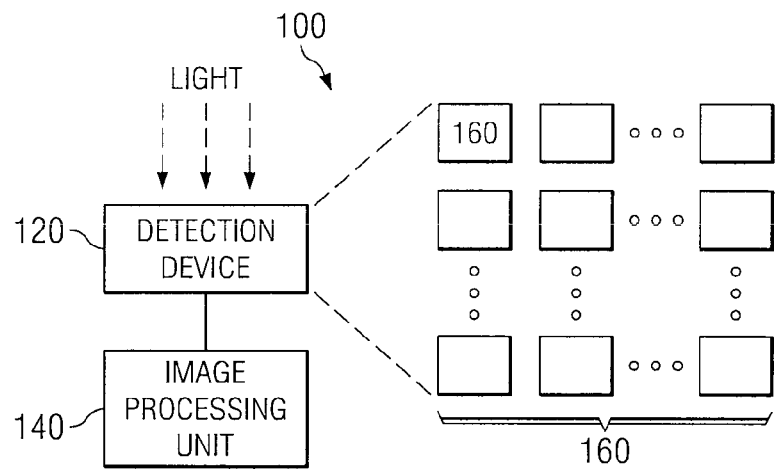
FIG. 2 depicts a simplified schematic diagram illustrating an imaging system, in accordance with embodiments of the present disclosure.

FIG. 2 is a block diagram illustrating imaging system 100, in accordance with embodiments of the present disclosure. For example, imaging system 100 may be a digital camera, video camera, or any other photographic and/or image capturing device. Imaging system 100 may include detection device 120 and image processing unit 140. Detection device 120 may be a focal plane array (FPA), active pixel sensor (APS) or any other suitable light sensing device that can capture images. Detection device 120 may include, for example, one or more diodes, charge-coupled devices (CCDs), or any other suitable photovoltaic detectors or transducers. Image processing unit 140 may be a combination of hardware, software, or firmware that is operable to receive signal information from detection device 120 and convert the signal information into an electronic image.

Detection device 120 may include an array of unit cells 160. Unit cells 160 may accumulate charge or produce a current and/or voltage in response to light incident upon the unit cell and may correspond to a pixel in a captured electronic image. The accumulated charge or the produced current and/or voltage may be used by processing unit 140 for processing of the incident light (e.g., to create an image representative of the incident light). In certain embodiments, one or more of unit cells 160 may include a position sensitive detector (PSD), such as the position sensitive detector depicted in FIGS. 4A and 4B.

Figure 3:
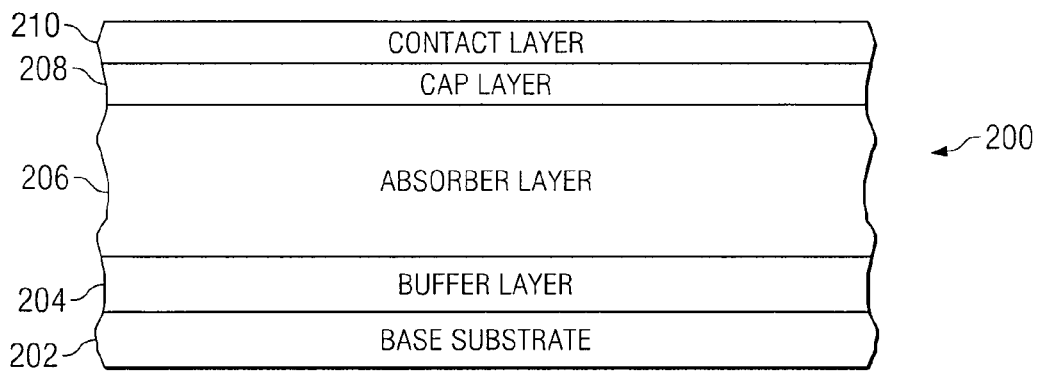
FIG. 3 depicts a cross-sectional view of a semiconductor substrate prior to post-processing to form a position sensitive detector, in accordance with certain embodiments of the present disclosure.

FIG. 3 depicts a cross-sectional view of a semiconductor substrate 200 prior to post-processing to form a PSD, in accordance with certain embodiments of the present disclosure. As shown in FIG. 3, substrate 200 may include base substrate 202, buffer layer 204, absorber layer 206, cap layer 208, and contact layer 210.

Base substrate 202 may comprise any substantially intrinsic semiconductor substrate (e.g., purely intrinsic or very lightly-doped), including without limitation silicon, cadmium zinc tellurium, germanium, silicon carbide, gallium antimonide, gallium arsenide, gallium nitride (GaN), gallium phosphide, indium antimonide, indium arsenide, indium nitride, indium phosphide, or other suitable semiconductor material. The material or materials used for base substrate 202 may be selected based on desired characteristics for a PSD to be fabricated from substrate 200 (e.g., a material may be selected based on having lattice properties similar to that of absorber layer 206 to be grown on base substrate 202).

Buffer layer 204 may comprise any suitable semiconductor substrate, including without limitation the semiconductors set forth above with respect to base substrate 202. Buffer layer 204 may be used to permit lattice matching between base substrate 202 and absorber layer 206. In certain embodiments, buffer layer 204 may be formed by epitaxially growing buffer layer 204 on base substrate 202 using vapor-phase epitaxy, liquid-phase epitaxy, solid-phase epitaxy, molecular beam epitaxy, or other suitable form of epitaxy. In the same or alternative embodiments, buffer layer 204 may be grown to a thickness of between approximately 0.0 μm and approximately 5.0 μm.

Absorber layer 206 may comprise any substantially doped semiconductor substrate (e.g., dopant concentration between approximately $2 \times 10^{14}$ cm$^{-3}$ and approximately $2 \times 10^{16}$ cm$^{-3}$), including without limitation the semiconductors set forth above with respect to base substrate 202. In certain embodiments, absorber layer 206 may include an n-type semiconductor substrate. Absorber layer 206 may absorb photons of light incident upon absorber layer 206 and such photons may excite electrons in absorber layer 206 to generate a photocurrent by means of the photovoltaic effect. The material or materials used for absorber layer 206 may be selected based on desired characteristics for a PSD to be fabricated from substrate 200 (e.g., a material may be selected with a bandgap suitable for photon absorbtion, and thus light detection, of a particular wavelength or range of wavelengths). In certain embodiments, absorber layer 206 may be formed by epitaxially growing absorber layer 206 on buffer layer 204 using vapor-phase epitaxy, liquid-phase epitaxy, solid-phase epitaxy, molecular beam epitaxy, or other suitable form of epitaxy (e.g., molecular beam epitaxy with flux of mercury, cadmium, and tellurium, with indium or arsenide as impurities). In the same or alternative embodiments, absorber layer 206 may be grown to a thickness of between approximately 1.0 μm and approximately 15.0 μm (e.g., to ensure absorber layer 206 is sufficiently thick to capture light of a particular intensity).

Cap layer 208 may comprise any substantially doped semiconductor substrate (e.g., dopant concentration between approximately $2 \times 10^{14}$ cm$^{-3}$ and approximately $2 \times 10^{16}$ cm$^{-3}$), including without limitation the semiconductors set forth above with respect to base substrate 202. In certain embodiments, cap layer 208 may include a p-type semiconductor substrate. In the same or alternative embodiments, cap layer 208 may be grown to a thickness of between approximately 0.5 μm and approximately 2.0 μm. The material or materials used for cap layer 208, the dopant concentration of cap layer 208, the thickness of cap layer 208, and/or other physical characteristics of cap layer 208 may be selected based on desired characteristics for a PSD to be fabricated from substrate 200 (e.g., selected physical characteristics may be selected based on a desired resitivity for cap layer 208). In certain embodiments, cap layer 208 may be formed by epitaxially growing cap layer 208 on absorber layer 206 using vapor-phase epitaxy, liquid-phase epitaxy, solid-phase epitaxy, molecular beam epitaxy, or other suitable form of epitaxy (e.g., molecular beam epitaxy with flux of mercury, cadmium, and tellurium, with indium or arsenide as impurities).

Contact layer 210 may comprise any highly-doped semiconductor substrate (e.g., dopant concentration between approximately $1 \times 10^{16}$ cm$^{-3}$ and approximately $1 \times 10^{18}$ cm$^{-3}$), including without limitation the semiconductors set forth above with respect to base substrate 202. In certain embodiments, contact layer 210 may include a highly doped p-type semiconductor substrate. In other embodiments, contact layer 210 may include a highly-doped n-type semiconductor substrate. In the same or alternative embodiments, contact layer 210 may be grown to a thickness of between approximately 0.5 μm and approximately 2.0 μm. The material or materials used for contact layer 210, the dopant concentration of contact layer 210, the thickness of contact layer 210, and/or other physical characteristics of contact layer 210 may be selected based on desired characteristics for a PSD to be fabricated from substrate 200 (e.g., selected physical characteristics may be selected based on a desired resitivity for contact layer 210). In certain embodiments, contact layer 210 may be formed by epitaxially growing contact layer 210 on cap layer 208 using vapor-phase epitaxy, liquid-phase epitaxy, solid-phase epitaxy, molecular beam epitaxy, or other suitable form of epitaxy (e.g., molecular beam epitaxy with flux of mercury, cadmium, and tellurium, with indium or arsenide as impurities).

After one or more of the various layers described above have been formed, substrate 200 may be used to fabricate one or more PSDs, as described in greater detail below.

Figure 4A:
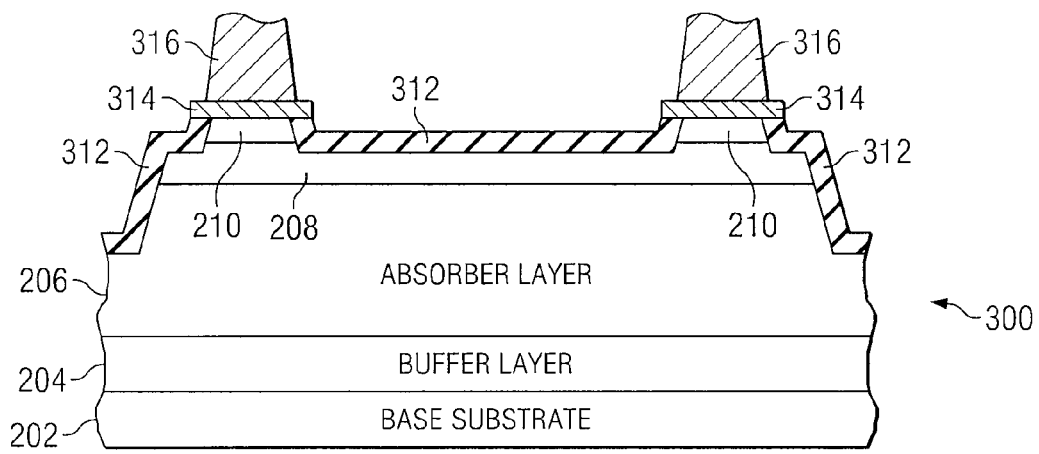
FIG. 4A depicts a cross-sectional view of a position sensitive detector fabricated with the semiconductor substrate of FIG. 3, in accordance with certain embodiments of the present disclosure.
Figure 4B:
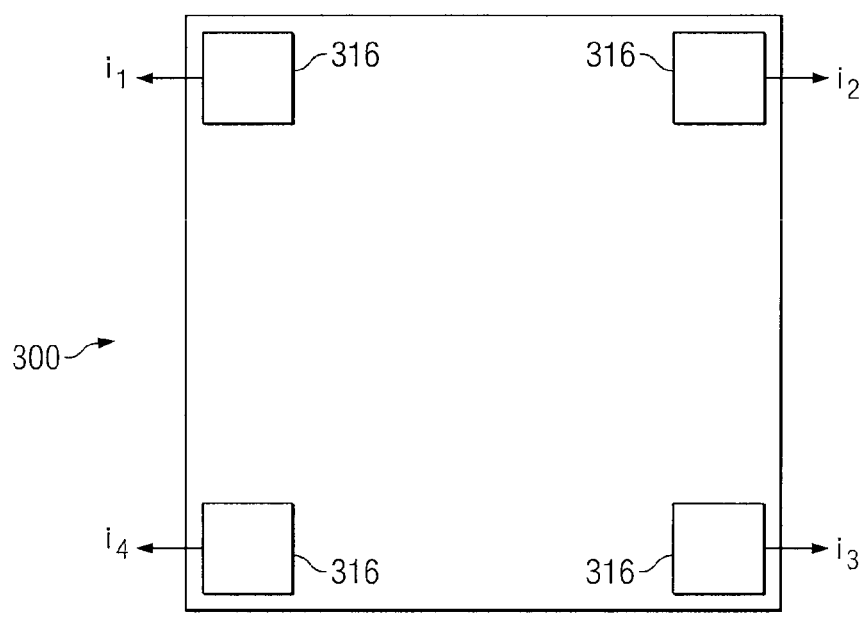
FIG. 4B depicts a plan view of the position sensitive detector depicted in FIG. 4A, in accordance with certain embodiments of the present disclosure.

FIGS. 4A and 4B depict different views of a PSD 300 fabricated using semiconductor substrate 200 of FIG. 3, in accordance with certain embodiments of the present disclosure. FIG. 4A depicts a cross-sectional view and FIG. 4B depicts a plan view. As shown in FIG. 4A, PSD 300 may include base substrate 202, buffer layer 204, absorber layer 206, cap layer 208, and contact layer 210 depicted in FIG. 3 and described above. In addition, PSD 300 may include passivation 312, contact metal 314, and bumps 316.

To fabricate PSD 300 from semiconductor substrate 200, portions of absorber layer 206, cap layer 208, and contact layer 210 may be etched from substrate 200 using any suitable etching technique (e.g., wet chemical etching or dry plasma etching). Portions of absorber layer 206 may be etched to, for example, to delineate and/or electrically isolate adjacent pixels from each other. Portions of cap layer 208 may be etched to, for example, optimize characteristics of PSD 300 (e.g., resitivity of the portion of cap layer 208 of PSD 300) and/or define a pixel area for PSD 300 (e.g., for when a PSD 300 is used as a unit cell in an array of PSDs 300). Portions of contact layer 210 may to etched to, for example, define one or more areas of substrate 200 to be electrically coupled to other electrical and/or electronic circuitry external to PSD 300.

After portions of absorber layer 206, cap layer 208, and contact layer 210 have been etched from substrate 200, passivation 312 may be deposited on top of the exposed portions of absorber layer 206, cap layer 208, and contact layer 210. Passivation 312 may include cadmium telluride or any other suitable material. Passivation 312 may be deposited on substrate 200 via thermal evaporation or molecular beam epitaxy. After deposition of passivation 312, portions of passivation 312 may be removed (e.g., via wet chemical etching or dry plasma etching in order to expose the remaining portions of contact layer 210. Passivation 312 may serve to prevent contact metal 314, bumps 316, and other materials from reacting with portions of substrate 200.

Contact metal 314 may be formed on portions of remaining contact layer 210 not covered by passivation 312 and may include a generally conductive material (e.g., aluminum, silver, copper, gold, or other suitable metal) to electrically couple contact layer 210 to corresponding bumps 316 and/or other electrical and/or electronic circuitry external to PSD 300. Contact metal 314 may be formed on substrate 200 via implantation, deposition, epitaxy, or any other suitable fabrication technique. For example, contact metal 314 may be formed by depositing aluminum upon substrate 200 and etching away those portions of the deposited aluminum which are not proximate to remaining portions of contact layer 210.

Bumps 316 may each be coupled to a corresponding portion of contact metal 314 and may include a generally conductive material (e.g., indium or other suitable metal) to electrically couple its corresponding contact metal 314 to other electrical and/or electronic circuitry external to PSD 300. Bumps 316 may be formed on substrate 200 via any suitable fabrication technique. For example, bump 212 may be formed by plating or thermal deposition.

As shown in FIG. 4B, PSD 300 may include four bumps 316 (which may themselves be coupled to corresponding contact metals 314 and portions of contact layer 210) that may in effect serve as electrical terminals or anodes for PSD 300. Although not depicted, PSD 300 may also include a cathode electrically coupled to absorber layer 206. For example, in embodiments where PSD 300 is an integral part of an array of identical or similar PSDS, such PSDs may include common elements (e.g., common absorber layer 206, common buffer layer 204, common base substrate 202) that may be coupled to a common cathode (e.g., at the periphery of the PSD array). Accordingly, in operation of PSD 300, photons absorbed by absorber layer 206 may generate a photocurrent which may flow through one or more of the bumps 316 as currents $i_1$, $i_2$, $i_3$, and $i_4$. By measuring the currents $i_1$, $i_2$, $i_3$, and $i_4$, a position of light incident upon PSD 300 (or the presence of light incident upon PSD 300) may be determined.

Figure 5A:
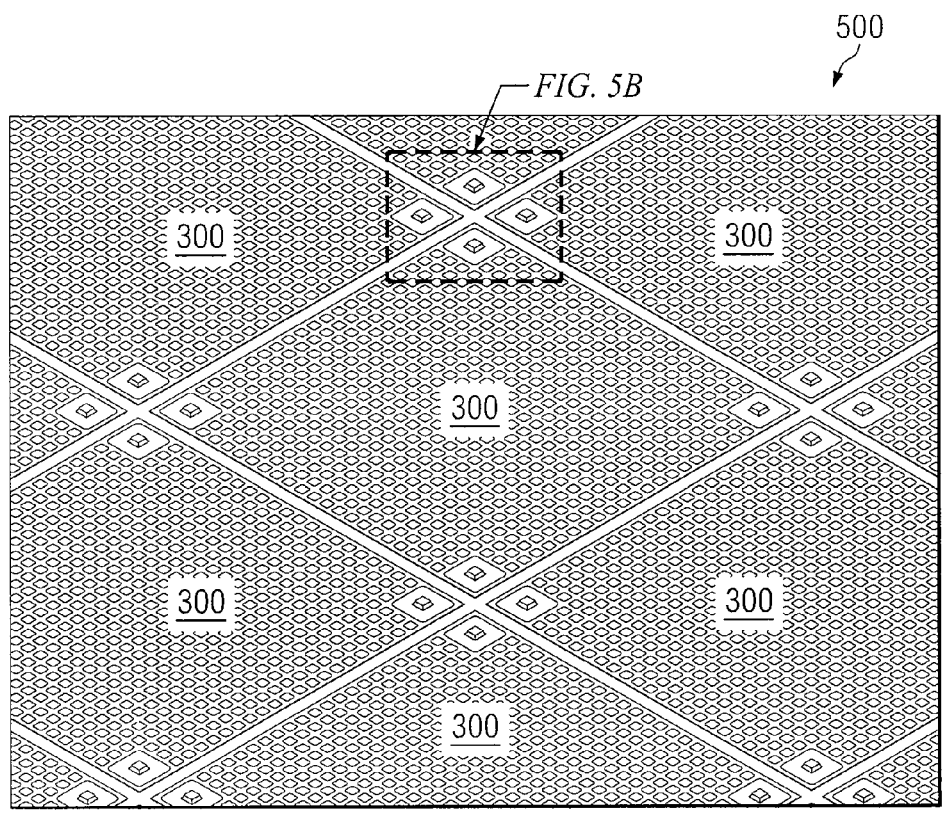
FIG. 5A depicts a perspective view of an array of position sensitive detectors, in accordance with certain embodiments of the present disclosure.
Figure 5B:
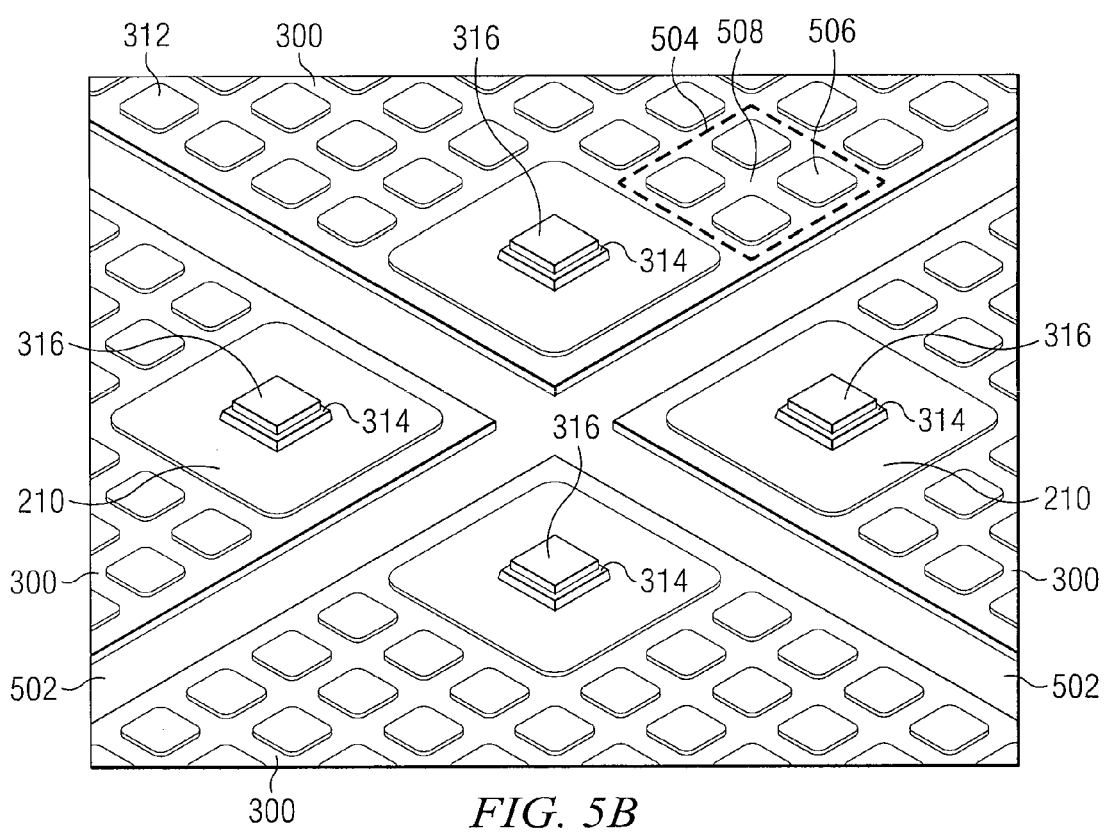
FIG. 5B depicts a close-up perspective view of the array of position sensitive detectors depicted in FIG. 5A, in accordance with certain embodiments of the present disclosure.

FIG. 5A depicts a perspective view of an array 500 of position sensitive detectors 300, in accordance with certain embodiments of the present disclosure. FIG. 5B depicts a close-up perspective view of the array 500 depicted in FIG. 5A. Array 500 may comprise a focal plane array (FPA) and/or any other suitable imaging device. As depicted in FIGS. 5A and 5B, array 500 may include a plurality of PSDs 300, mesa delineation 502 and grid delineation 504.

In certain embodiments, array 500 of PSDs 300 may be formed from a single semiconductor substrate (e.g., substrate 200). In such embodiments, certain portions of one or more PSDs 300 may be common to each other. For example, each PSD 300 in array 500 may have a common base substrate 202, a common buffer layer 204, and a common absorber layer 206. In addition, each individual PSD 300 of array 500 may have its own cap layer 208 and its own contacts (e.g., bumps 316 and unetched portions of contact layer 210 and contact metal 314) defining a pixel in array 500.

Mesa delineation 502 may also have the effect of defining individual PSDs 300/pixels in array 500. Mesa delineation 502 may be formed by selectively etching portions of absorber layer 206, cap layer 208, and/or contact layer 210 of substrate 200 as discussed above with respect to the fabrication of an individual PSD 300 as shown FIGS. 4A and 4B above.

Grid delineation 504 may be formed by selectively etching portions of cap layer 208 to form a grid, other shape, pattern, and/or collection of features. For example, grid delineation 504 may be formed after etching of contact layer 210, and may be formed via wet chemical etching or dry plasma etching. In FIGS. 5A and 5B, the grid delineation of cap layer 208 shown covered by passivation 312. As depicted in FIGS. 5A and 5B, grid delineation 504 may be formed by creating a plurality of raised features 506 and a plurality of troughs 508. The physical dimensions of grid delineation 504 (e.g., the height, length, and/or width of raised features 506 and/or the width and/or depth of troughs 508) may be selected based on desired characteristics for PSDs 300 making up array 500 (e.g., selected physical characteristics may be selected based on a desired resitivity for the portion of cap layer 208 remaining in each PSD 300).

Advantages of the methods and systems described herein may include PSDs that may be optimized for particular applications and uses (e.g., for use with particular desired wavelengths), as well as other characteristics. For example, a desired cut-off wavelength for light to be detected by the PSD may be realized by forming an absorber layer of a suitable semiconductor composition with a bandgap supporting such cut-off wavelength. By employing epitaxial growth of the absorber layer, a wider variety of materials and compositions may be used, thus allowing for a wide range of wavelength selectivity (including detecting in the infrared range, for which traditional PSDs are unsuited).

In addition, by forming a cap layer with a suitable semiconductor composition and dopant concentration, the resistance of the cap layer, and thus the spatial resolution of individual PSDs, may be optimized for particular applications and uses. The resistance of the cap layer (and thus the spatial resolution of individual PSDs) may further be optimized through grid delineation of the cap layer. By employing epitaxial growth of the cap layer, a wider variety of materials and compositions may be used, and dimensions of the cap layer may be controlled with greater precision, thus allowing for a wide range of spatial resolution selectivity.

Furthermore, by forming contacts using portions of a contact layer of a suitable semiconductor composition, dopant concentration, and dimensions, the contact resistance for PSDs may be optimized for particular applications and uses. By employing epitaxial growth of the contact layer, a wider variety of materials and compositions may be used, and dimensions of the contact layer may be controlled with greater precision, thus allowing for a wide range of resistance selectivity.

Although the embodiments in the disclosure have been described in detail, numerous changes, substitutions, variations, alterations, and modifications may be ascertained by those skilled in the art. Additionally or alternatively, while the disclosure may be described predominantly in reference to infrared detectors, the embodiments disclosed herein may be utilized with many types of detectors including, but not limited to, visible, infrared, ultraviolet, x-ray, or other radiation detectors. It is intended that the present disclosure encompass all such changes, substitutions, variations, alterations and modifications as falling within the spirit and scope of the appended claims.

What is claimed is:

1. A unit cell for use in an imaging system, comprising:
an absorber layer of semiconductor material formed on a semiconductor substrate, the absorber layer configured to absorb incident photons such that the absorbed photons excite electrons in the absorber layer to generate a photocurrent, the absorber layer electrically coupled to a cathode positioned at a periphery of the unit cell;
a plurality of anodes electrically coupled to the absorber layer and configured to conduct the photocurrent to one or more electrical components external to the unit cell, the plurality of anodes including semiconductor material formed on the semiconductor substrate, the plurality of anodes comprising a first semiconductor composition, a first dopant concentration, and a first dimension selected to provide a first optimized resistivity; and
a cap layer of semiconductor material formed on the semiconductor substrate and electrically coupled to and formed between the absorber layer and the plurality of anodes and including a grid delineation, the cap layer configured to conduct the photocurrent between the absorber layer and the plurality of anodes, the cap layer comprising a second semiconductor composition, a second uniform and continuous dopant concentration, and a second dimension selected independently from the selection of the first semiconductor composition, the first dopant concentration, and the first dimension, to provide a second optimized resistivity.

2. The unit cell of claim 1, wherein the semiconductor material of at least one of the absorber layer, the cap layer and the plurality of anodes is formed using epitaxy.

3. The unit cell of claim 1, wherein the semiconductor material of the absorber layer is selected to absorb photons of infrared wavelengths.

4. The unit cell of claim 1, wherein the absorber layer comprises a doped n-type semiconductor.

5. The unit cell of claim 1, wherein the cap layer comprises a doped p-type semiconductor.

6. The unit cell of claim 1, wherein the at least one anode plurality of anodes comprises a highly-doped n-type or p-type semiconductor.

7. The unit cell of claim 1, wherein the substrate comprises at least one of silicon and cadmium zinc telluride.

8. The unit cell of claim 1, wherein the substrate comprises a buffer layer configured to provide lattice matching between the absorber layer and the semiconductor substrate.

9. The unit cell of claim 1, wherein the unit cell comprises a photosensitive detector.

10. The unit cell of claim 1, wherein the plurality of anodes also includes metal configured to conduct the photocurrent between the plurality of anodes and one or more electrical components external to the unit cell.

11. A system for image sensing comprising:
at least one unit cell including:
an absorber layer of semiconductor material formed on a semiconductor substrate, the absorber layer configured to absorb incident photons such that the absorbed photons excite electrons in the absorber layer to generate a photocurrent;
a plurality of anodes electrically coupled to the absorber layer and configured to conduct the photocurrent to one or more electrical components external to the unit cell, the plurality of anodes including semiconductor material formed on the semiconductor substrate; and
a cap layer of semiconductor material formed on the semiconductor substrate and electrically coupled to and formed between the absorber layer and the plurality of anodes and including a grid delineation, the cap layer configured to conduct the photocurrent between the absorber layer and the plurality of anodes,
wherein a semiconductor composition, a uniform and continuous dopant concentration, and a dimension of each of the plurality of anodes and the cap layer are independently optimized to provide a selected resistance for each of the plurality of anodes and the cap layer;
a processing unit communicatively coupled to the at least one unit cell; and
a cathode electrically coupled to the absorber layer and positioned at a periphery of the at least one unit cell.

12. The system of claim 11, wherein the semiconductor material of at least one of the absorber layer, the cap layer and the plurality of anodes is formed using epitaxy.

13. The system of claim 11, wherein the semiconductor material of the absorber layer is selected to absorb photons of infrared wavelength.

14. The system of claim 11, wherein:
the absorber layer comprises a doped n-type semiconductor;
the cap layer comprises a doped p-type semiconductor; and
the plurality of anodes comprises a highly-doped n-type or p-type semiconductor.

15. The system cell of claim 11, wherein the unit cell comprises a photosensitive detector.

16. The unit cell of claim 1, further comprising a plurality of unit cells that are electrically coupled to the cathode at a periphery of the plurality of unit cells, wherein the semiconductor substrate and absorber layer are configured to be common to the plurality of unit cells.

17. The system of claim 11, wherein the at least one unit cell further comprises a plurality of unit cells that are electrically coupled to the cathode at a periphery of the plurality of unit cells, wherein the semiconductor substrate and absorber layer are configured to be common to the plurality of unit cells.

* * * * *

UNITED STATES PATENT AND TRADEMARK OFFICE
CERTIFICATE OF CORRECTION

| | |
|---|---|
| PATENT NO. | : 8,669,588 B2 |
| APPLICATION NO. | : 12/497878 |
| DATED | : March 11, 2014 |
| INVENTOR(S) | : Smith et al. |

It is certified that error appears in the above-identified patent and that said Letters Patent is hereby corrected as shown below:

In the Claims

Column 7, claim 6, line 39, delete "at least one anode".

Signed and Sealed this
Twenty-seventh Day of May, 2014

Michelle K. Lee
*Deputy Director of the United States Patent and Trademark Office*